(12) United States Patent
Liaw et al.

(10) Patent No.: US 8,748,906 B2
(45) Date of Patent: Jun. 10, 2014

(54) LED LEAD FRAME HAVING INSERT-MOLDED ELECTROSTATIC DISCHARGE PROTECTION DEVICE

(75) Inventors: Been-Yang Liaw, New Taipei (TW); Cheng-Ching Chien, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 197 days.

(21) Appl. No.: 13/286,229

(22) Filed: Nov. 1, 2011

(65) Prior Publication Data

US 2012/0106118 A1 May 3, 2012

(51) Int. Cl.
*H01L 27/15* (2006.01)
*H01L 29/267* (2006.01)
*H01L 31/12* (2006.01)
*H01L 33/00* (2010.01)

(52) U.S. Cl.
USPC .............................. 257/81; 257/100; 257/433

(58) Field of Classification Search
USPC ................. 257/79, 81, 82, 99, 100, 432, 433, 257/E25.032, 666
See application file for complete search history.

(56) References Cited

U.S. PATENT DOCUMENTS

| 7,462,870 | B2 | 12/2008 | Nakashima | |
| 2006/0267040 | A1* | 11/2006 | Baek et al. | 257/99 |
| 2007/0029564 | A1 | 2/2007 | Han | |
| 2007/0194422 | A1* | 8/2007 | Lai et al. | 257/684 |
| 2007/0278499 | A1* | 12/2007 | Ha et al. | 257/79 |
| 2008/0296592 | A1* | 12/2008 | Osamu | 257/89 |
| 2010/0264449 | A1* | 10/2010 | Hayashi | 257/98 |
| 2011/0012151 | A1* | 1/2011 | Ono | 257/98 |
| 2012/0104426 | A1* | 5/2012 | Chan et al. | 257/89 |
| 2012/0132937 | A1* | 5/2012 | Chan et al. | 257/89 |
| 2012/0161180 | A1* | 6/2012 | Komatsu et al. | 257/98 |
| 2013/0020590 | A1* | 1/2013 | Lin et al. | 257/88 |

FOREIGN PATENT DOCUMENTS

| CN | 1873974 A | 12/2006 |
| CN | 101029710 A | 9/2007 |
| CN | 101521196 A | 9/2009 |
| CN | 101752355 A | 6/2010 |

* cited by examiner

*Primary Examiner* — S. V. Clark
(74) *Attorney, Agent, or Firm* — Wei Te Chung; Ming Chieh Chang

(57) ABSTRACT

An LED lead frame includes an insulative base having a cavity on one side. A pair of conductive leads each has an end exposed in the cavity and another end extended out of insulative base. An electrostatic discharge protection device is insert-molded in the insulative base with only one side thereof exposed out of the insulative base, and is electrically interconnecting with the conductive leads.

12 Claims, 3 Drawing Sheets

LED LEAD FRAME HAVING INSERT-MOLDED ELECTROSTATIC DISCHARGE PROTECTION DEVICE

BACKGROUND OF THE INVENTION

1. Field of the invention

The present invention relates to an LED lead frame, and more particularly to an LED lead frame having an electrostatic discharge protection device insert-molded in an insulative base with a side thereof exposed out of insulative base.

2. Description of Related Art

U.S. Pat. No. 7,462,870 issued to Nakashima on Dec. 9, 2008 discloses a semiconductor device including an insulative base with a concave cavity in which an LED chip is seated. A plurality of metal members are mounted in the base to be connected to the LED chip. The metal member is partially embedded in the insulative base with one end thereof exposed in the cavity and the other end extending out of the insulative base for being mounted to an external device. The cavity has a recess on a step of the side wall thereof to receive a protective element for protecting the LED chip destroyed by static. The protective element is mounted in a center of the recess without engaging with sides walls of the recess.

However, the protective element can absorb part light of the LED chip that will result the semiconductor device has a lower brightness.

Therefore, an improved semiconductor device is desired.

SUMMARY OF THE INVENTION

An object of the present invention is to provide an LED lead frame having an electrostatic discharge protection device being insert-molded in an insulative base with only side thereof exposed out of insulative base.

According to one aspect of the present invention, there is provided an LED lead frame comprises an insulative base having a cavity on one side. A pair of conductive leads each has an end exposed in the cavity and another end extended out of insulative base. An electrostatic discharge protection device is insert-molded in the insulative base with only one side thereof exposed out of the insulative base, and is electrically interconnecting with the conductive leads.

According to another aspect of the present invention, there is provided an LED lead frame comprises an insulative base having a cavity on one side. A plurality of conductive leads each has an end exposed in the cavity and another end extended out of insulative base. An electrostatic discharge protection device is insert-molded in the insulative base and located in the cavity. The electrostatic discharge protection device electrically interconnects with the conductive leads and has at most one side exposed out of the insulative base.

Other objects, advantages and novel features of the invention will become more apparent from the following detailed description of a preferred embodiment when taken in conjunction with the accompanying drawings.

DETAILED DESCRIPTION OF THE INVENTION

Figure 1:
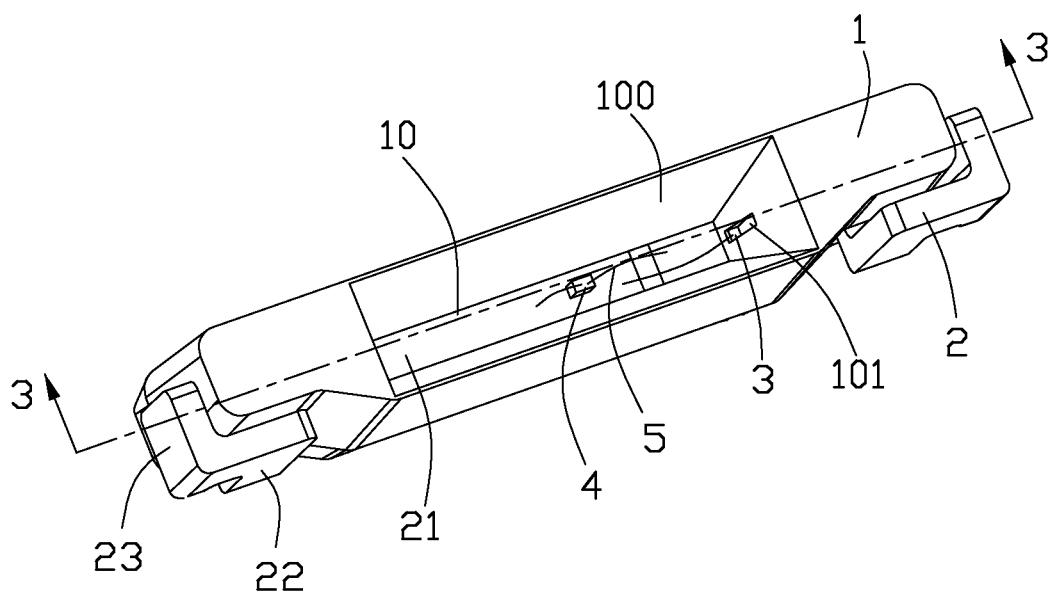
FIG. 1 is a perspective view of an LED lead frame in accordance with the present invention.

Referring to FIG. 1, an LED lead frame made in accordance with a preferable embodiment of the present invention is shown. The LED lead frame is used to connect an LED chip 4 and includes an insulative base 1, a pair of conductive leads 2 mounted with the insulative base 1, and an electrostatic discharge protection device 3 mounted in the insulative base 1.

Figure 2:
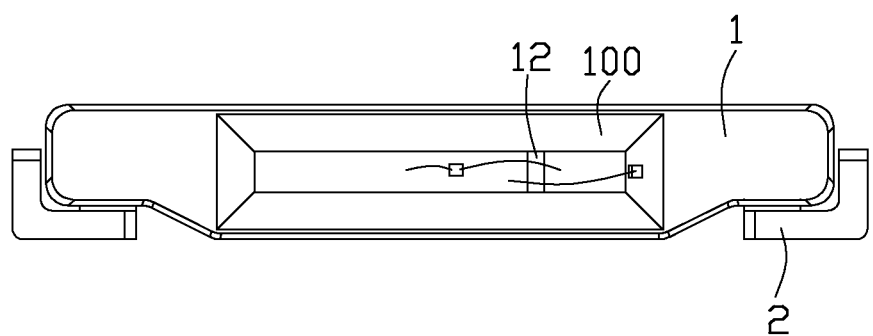
FIG. 2 is a top, perspective view of the LED lead frame shown in FIG. 1.
Figure 3:
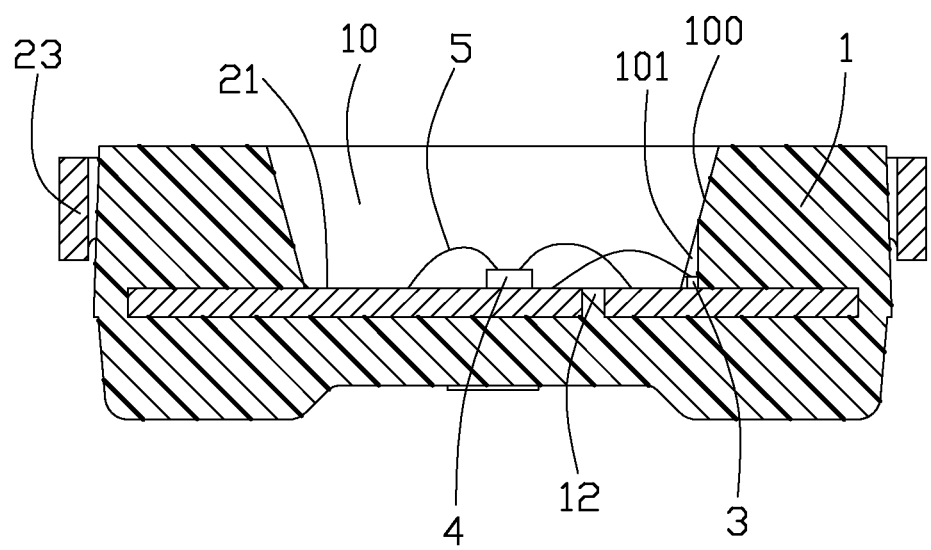
FIG. 3 is cross-sectional view taken along line 3-3 of FIG. 1.

Continuing referring to FIG. 1, the insulative base 1 has a rectangular shape with a concave cavity 10. The cavity 10 has a plurality of slanting inner walls 100 extending radial from a bottom surface of the cavity 10 to a top surface of the insulative base 1. Referring to FIGS. 1-3, the pair of conductive leads 2 with one ends thereof are exposed in the bottom surface of the cavity 10 to form to two connecting portions 21 which are separated by a rib 12 of the insulative base 1. The LED chip 4 is disposed on one of the conductive leads 2 in the cavity 16 and electrically connects with connecting portions 21 of the two conductive leads 2 by two wires 5. Each conductive lead 2 includes a solder portion 22 which is formed by the other end of the conductive lead 2 extending from one side of the insulative base 1 and then bent to the other side of the insulative base 1 to form an end portion 23. The solder portions 22 of the two conductive leads 2 are disposed on one side of the insulative base 1 and the end portions 23 of the two conductive leads 2 are disposed on two opposite sides of the insulative base 1.

The electrostatic discharge protection device 3 is insert-molded in the insulative base 1 with one side thereof exposed out of the insulative base 1 and other sides embedded within the insulative base 1 and the conductive leads 2. Referring to FIG. 3, the electrostatic discharge protection device 3 is insert-molded in the inner wall 100 of the cavity 10 of the insulative base 1. Specifically, the electrostatic discharge protection device 3 is mounted on one of the two conductive leads 2, and corresponding top side is exposed out of the insulative base 1 for connecting the other conductive lead 2 by a wire. Except the two opposite sides, other sides of the electrostatic discharge protection device 3 are surrounded and embedded within the insulative base 1. In the above embodiment, the exposed side of the electrostatic discharge protection device 3 is facing upwardly, not facing toward the LED chip 4, so the electrostatic discharge protection device 3 will not reduce the brightness of the LED chip 4 by absorbing its emitted light energy. A recess 101 is defined upon the exposed side of the electrostatic discharge protection device 3 on the inner wall 100 of the cavity 10 for providing enough room to conveniently connecting the wire to the electrostatic discharge protection device 3.

The LED lead frame is formed by providing a pair of conductive leads 2 by stamping. The electrostatic discharge protection device 3 is disposed on one of the conductive leads 2 by conductive adhesive or other viscous materials. Then injecting molten plastic over the conductive leads 2 and the electrostatic discharge protection device 3, and is then solidified under a lower temperature to form the insulative base 1 and a recess 101 above the electrostatic discharge protection device 3 to expose a top side of the electrostatic discharge protection device 3. The solder portions 22 and the end portions 23 are bent after the insulative base 1 is formed.

In the present invention, the electrostatic discharge protection device 3 is insert-molded in the insulative base 1 with one side thereof exposed out of the insulative base 1, so it can reduce the electrostatic discharge protection device 3 from absorbing the light emitted from the LED chip 4. Furthermore, the electrostatic discharge protection device 3 will not exhaust the room of the cavity 10 while increasing the size of the LED lead frame, so it can meet the trend of miniaturization.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An LED lead frame comprising:
an insulative base having a cavity on one side;
a pair of conductive leads each having an end exposed in the cavity and another end extended out of insulative base; and
an electrostatic discharge protection device being insert-molded in the insulative base with only one side thereof exposed out of the insulative base, and being electrically interconnecting with the conductive leads;
wherein the cavity is formed by a plurality of slanting inner walls extending radial from a bottom surface of the cavity to a top surface of the insulative base, and the electrostatic discharge protection is disposed on the inner wall with the top side exposed out of the insulative base.

2. The LED lead frame as claimed in claim 1, wherein the insulative base defines a recess upon the exposed side of the electrostatic discharge protection device to make the exposed side of the electrostatic discharge protection device exposed out of the insulative base.

3. The LED lead frame as claimed in claim 1, wherein the electrostatic discharge protection device is disposed on the conductive leads.

4. The LED lead frame as claimed in claim 1, wherein the insulative base has a rib extending upwardly to separate the conductive leads individually.

5. The LED lead frame as claimed in claim 1, wherein the conductive leads have solder portions extend from the one side of the insulative base and end portions disposed at two opposite sides of the insulative base.

6. An LED lead frame comprising:
an insulative base having a cavity on one side;
a plurality of conductive leads each having an end exposed in the cavity and another end extended out of insulative base; and
an electrostatic discharge protection device being insert-molded in the insulative base and located in the cavity, the electrostatic discharge protection device electrically interconnecting with the conductive leads and having at most one side exposed out of the insulative base;
wherein the cavity is formed by a plurality of slanting inner walls and a bottom surface, and the electrostatic discharge protection is disposed on the inner wall of the insulative base.

7. The LED lead frame as claimed in the claim 6, wherein the electrostatic discharge protection device is insert-molded in an inner wall of the cavity.

8. The LED lead frame as claimed in the claim 6, wherein a bottom surface of the electrostatic discharge protection device is disposed on one of the conductive leads, the opposite side of the electrostatic discharge protection device is exposed out of the insulative base, and other sides of the electrostatic discharge protection device are surrounded and engaged with the insulative base.

9. The LED lead frame as claimed in the claim 6, wherein the electrostatic discharge protection is disposed on the conductive lead before the insulative base is formed on the conductive leads.

10. The LED lead frame as claimed in the claim 6, wherein said electrostatic discharge protection is exposed only upwardly.

11. The LED lead frame as claimed in the claim 6, wherein said one side is an upward side.

12. The LED lead frame as claimed in the claim 8, wherein an LED chip is mounted upon another of the conductive leads.

* * * * *